United States Patent [19]

Zhang et al.

[11] Patent Number: 4,835,653
[45] Date of Patent: May 30, 1989

[54] ESD PROTECTION CIRCUIT EMPLOYING CHANNEL DEPLETION

[75] Inventors: Xiaonan Zhang; Xiaolan Wu, both of San Diego, Calif.

[73] Assignee: Unisys Corporation, Blue Bell, Pa.

[21] Appl. No.: 145,138

[22] Filed: Jan. 19, 1988

[51] Int. Cl.$^4$ .............................................. H02H 9/04
[52] U.S. Cl. ....................................... 361/90; 361/56; 361/58; 361/88; 361/91; 361/92; 361/111; 357/23.13; 357/48
[58] Field of Search .................... 361/91, 56, 58, 111, 361/90; 357/23.13, 23.14, 41, 23.1, 22 C, 22 F, 22 G, 48

[56] References Cited

U.S. PATENT DOCUMENTS

| | | | |
|---|---|---|---|
| 3,395,290 | 7/1968 | Farina et al. | 361/91 |
| 3,947,727 | 3/1976 | Stewart | 361/91 |
| 4,086,642 | 4/1978 | Yoshida et al. | 361/91 |
| 4,264,941 | 4/1981 | London | 361/91 |
| 4,605,980 | 8/1986 | Hartranft et al. | 361/56 |

OTHER PUBLICATIONS

Sedra, Adel S. and Kenneth C. Smith, *Microelectronic Circuits*, 1982, p. 252.

*Primary Examiner*—A. D. Pellinen
*Assistant Examiner*—David Osborn
*Attorney, Agent, or Firm*—Charles J. Fassbender; Kenneth L. Miller

[57] ABSTRACT

An electrostatic discharge protection circuit includes a P$^-$ doped channel and an N$^-$ doped channel that form a serial path between a signal pad and a transistor. Holes are depleted from the P$^-$ doped channel in response to a negative electrostatic discharge on the input signal pad; and electrons are depleted from the N$^-$ doped channel in response to a positive electrostatic discharge on the input signal pad. When either depletion occurs, the path from the signal pad to its transistor is open circuited; and so the transistor is protected. Conversely, when no electrostatic charge exists on the signal pad, the path through the P$^-$ doped channel and the N$^-$ doped channel is highly conductive; and so signals pass between the pad and the transistor very quickly.

14 Claims, 3 Drawing Sheets

ESD PROTECTION CIRCUIT EMPLOYING CHANNEL DEPLETION

BACKGROUND OF THE INVENTION

This invention relates to electrostatic discharge protection circuits (ESD protection circuits) for integrated circuit chips.

Basically, in an integrated circuit chip, metal signal pads are provided to which discrete wires are bonded to thereby provide a means for sending input signals to the chip and receiving output signals from the chip. Those signals, under normal operating conditions, are restricted to lie within a certain voltage range. Typically, that voltage range is within ±5 volts. However, due to electrostatic charge, the voltage on the signal pads can, for a short time period (e.g., a few nanoseconds), become 1,000 volts or higher.

Such electrostatic charge usually accumulates first on one's body. A simple circuit, which approximates the equivalent circuit for the human body, is a 100 picofarad capacitor C in series with a 1,500 ohm resistor R. Thus, by accumulating a charge Q of just $1 \times 10^{-7}$ Coulumb's on the capacitor, the voltage V across it becomes 1,000 volts ($Q=VC$). This amount of charge, either positive or negative, can readily be accumulated by a person in various ways, such as by walking in shoes with rubber soles across a rug. That charge will then be transferred from the person to a signal pad on a chip if the person contacts either the pad, or a wire to which the pad is connected.

After this charge is transferred to the signal pad, it can flow from the pad as a large current to any transistors which are connected on the chip to the pad. And this large current can burn out the transistors. So to address this problem, various static discharge protection circuits have been proposed in the prior art. See, for example, U.S. Pat. Nos. 4,481,421 and 4,605,980, and 4,686,602. However, the protection circuits of these patents, and others, have a serious deficiency.

That deficiency, the present inventors have found, is that the conductance from each signal pad to its transistor is fixed at some predetermined level. This is a problem because if the conductance is high, then any electrostatic charge on the signal pad will pass right to the pad's transistor (just like a normal input signal) and burn out the transistor. Burnout occurs even if a Zener diode is placed in parallel with the path to divert charge from the transistor since the diode will have some resistance, and the charge will tend to follow the high conductance path.

Conversely, if the conductance is lowered by adding a resistor in series between the signal pad and its transistor, then less electrostatic charge will pass from the signal pad to its transistor. But then, normal input signals will also pass more slowly to the transistor. This signal delay will occur because some parasitic capacitance is always present in the path from the signal pad to its transistor, and that capacitance together with the added resistor will act as a low pass filter. And, in high speed electronic systems such as digital computers, signal delay must be minimized.

Accordingly, a primary object of the invention is to provide an improved static discharge protection circuit for integrated circuits in which the above problem is overcome.

BRIEF SUMMARY OF THE INVENTION

In accordance with the invention, the above object and others are achieved by fabricating an electrostatic discharge protection circuit, between a signal pad and its transistor, with a novel architecture. This novel protection circuit includes a P− doped channel and an N− doped channel that form a serial path between the signal pad and the transistor. Also, a means is coupled to the P− doped channel for depleting holes from it in response to a negative electrostatic discharge on the input signal pad; and another means is coupled to the N− doped channel for depleting electrons from it in response to a positive electrostatic discharge on the input signal pad. When the holes are depleted from the P− doped channel, or the electrons are depleted from the N− doped channel, the path from the signal pad to its transistor is open circuited; and so the transistor is protected. Conversely, when no electrostatic charge exists on the signal pad, the path through the P− doped channel and the N− doped channel is highly conductive; and so signals pass between the pad and the transistor very quickly.

BRIEF DESCRIPTION OF THE DRAWINGS

Various embodiments of the invention are described in the Detailed Description in conjunction with the accompanying drawings wherein.

DETAILED DESCRIPTION OF THE INVENTION

Figure 1:
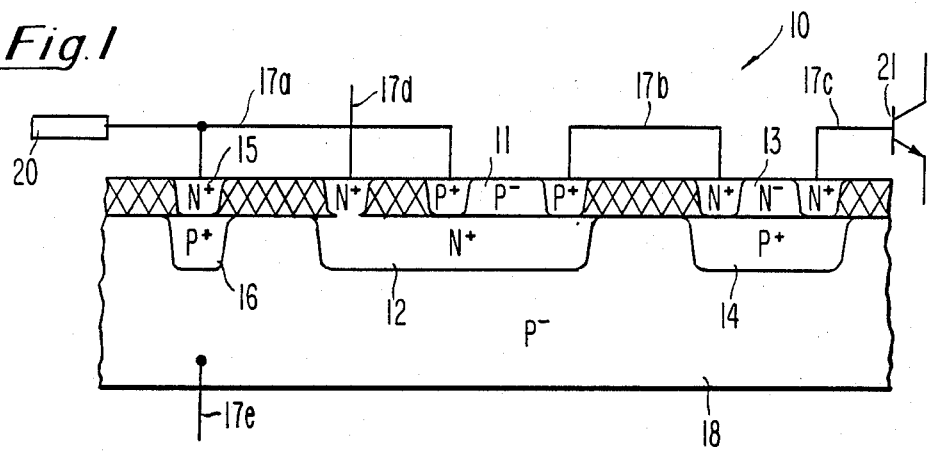
FIG. 1 is a greatly enlarged sectional view of one embodiment of the invention.

Referring now to FIG. 1, a preferred embodiment of an electrostatic discharge protection circuit 10 which is constructed according to the invention will be described in detail. This protection circuit 10 is comprised of several doped regions 11–16 and their interconnections 17a–17e, all of which are integrated on a semiconductor substrate 18. Circuit 10 is connected between a signal pad 20 and a transistor 21 by conductors 17a and 17c as shown. Note that for simplicity, signal pad 20, transistor 21, and conductors 17a–17c are shown schematically; but in actuality, they too are integrated with substrate 18 in any conventional fashion.

In the FIG. 1 embodiment, substrate 18 is doped P−; regions 12 and 15 are doped N+; regions 14 and 16 are doped P+; region 11 has two P+ doped spaced-apart ends which make ohmic contact with conductors 17a and 17b respectively, and the remaining central portion of region 11 is doped P−; region 13 has two N+ doped spaced-apart ends which make ohmic contact with conductors 17b and 17c, and the remaining central portion of region 13 is doped $N^-$. Cross-hatching in FIG. 2 indicates an insulator, such as $SiO_2$.

Figure 2:
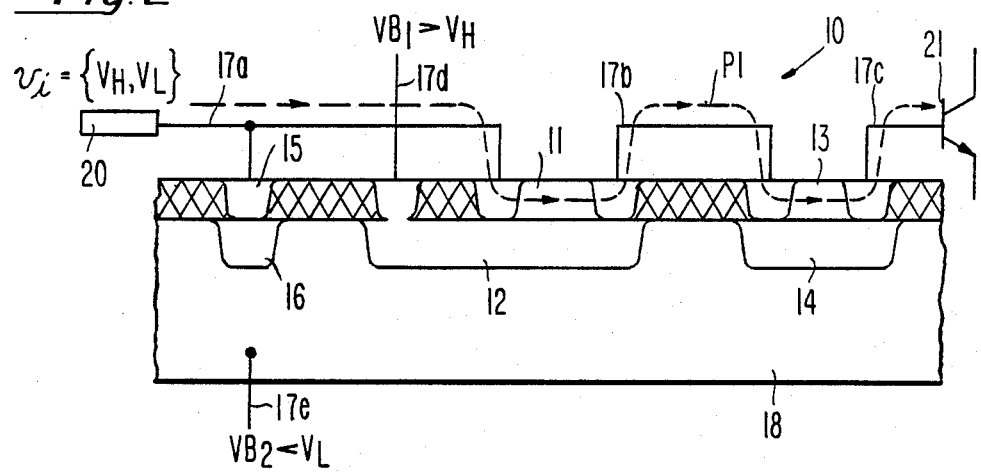
FIG. 2 illustrates the operation of the FIG. 1 embodiment under normal operating conditions.

Under normal operating conditions, an input voltage $v_i$ that is to be received by input transistor 21 is applied by an external source to input pad 20. This is shown in FIG. 2. That input voltage has a high level $V_H$ and a low level $V_L$. Also, a bias voltage $VB_1$ which is greater than the voltage level $V_H$ is applied to the doped region 12 through conductor 17d; and another bias voltage, $VB_2$, which is less than voltage level $V_L$, is applied to the substrate 18 via conductor 17e.

When voltages $v_i$, $VB_1$ and $VB_2$ are applied as described above, the P-N junctions between regions 11 and 12, 13 and 14, and 15 and 16 are all reverse biased. Thus, voltage signal $v_i$ travels from input pad 20 to transistor 21 along a serial path P1 through components 17a, 11, 17b, 13, and 17c. In other words, the $P^-$ portion of region 11 operates on a channel in which holes carry the input signal $v_i$, and the $N^-$ portion of region 13 operates on another channel in which electrons carry the input signal $v_i$.

Figure 3:
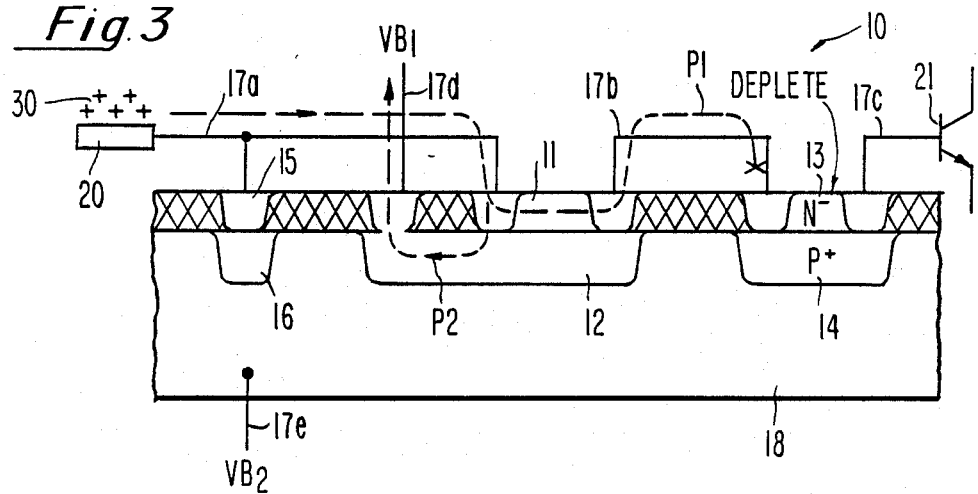
FIG. 3 illustrates the operation of the FIG. 1 embodiment under the condition where positive charges are deposited on the signal pad.

Suppose now that an electrostatic discharge occurs in which positive charges 30 are deposited on input pad 20. This is illustrated in FIG. 3. When that occurs, the P-N junction between regions 11 and 12 will become forward biased. Also, the P-N junctions between regions 13 and 14, and between regions 15 and 16 will become much more strongly reverse biased than they were under the FIG. 2 conditions.

Due to this strong reverse bias, that portion of region 13 which is doped $N^-$ will become totally depleted of mobile charges (i.e., electrons). Consequently, the resistance of path P1 will become so high that it is essentially an open circuit. Further details on how this occurs will be described shortly in conjunction with FIGS. 5, 6 and 7.

Also, due to the forward biasing of the junction between regions 11 and 12, a new conductive path P2 will be formed which serially passes through components 17a, 11, 12, and 17d. And along this path P2, the positive charges 30 on input pad 20 (plus the input voltage which those charges produce) are diverted from transistor 21.

Figure 4:
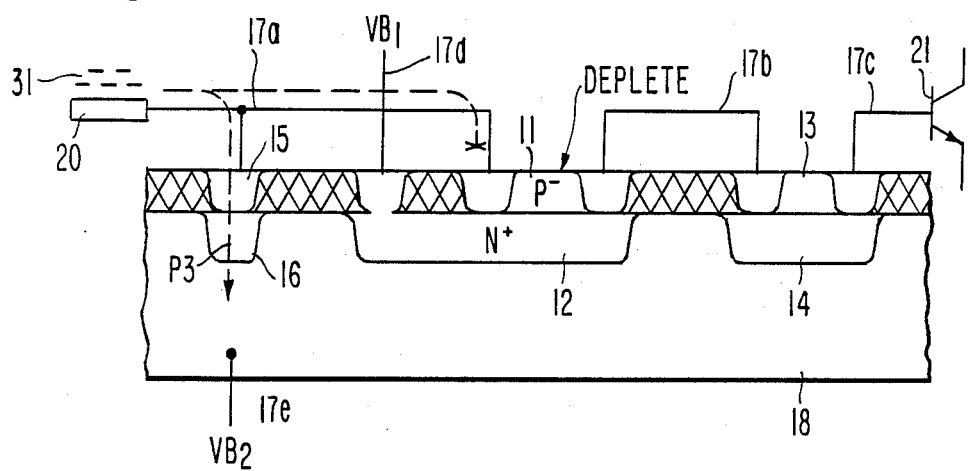
FIG. 4 shows the operation of the FIG. 1 embodiment under the condition where negative charges are deposited on the signal pad.

Next, suppose that negative electrostatic charges 31 are deposited on input pad 20. That situation is illustrated in FIG. 4. When that occurs, the reverse bias on the junction between regions 11 and 12 becomes so large that the $P^-$ portion of region 11 gets completely depleted of mobile charges (i.e., holes). Thus, region 11 becomes an open circuit for path P1.

Also in response to the negative charge 31, the junction between regions 15 and 16 becomes forward biased. This in turn forms a new conductive path P3 which serially goes through components 17a, 15, 18, and 17e. Thus, the negative charges 31 (and the input voltage which they produce) pass along path P3, rather than path P1; and that protects the input transistor 21.

Figure 5:
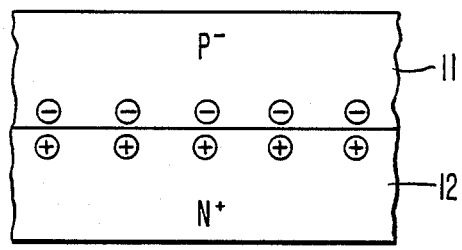
FIG. 5 shows the operation of a P− channel in the FIG. 1 embodiment under normal operating conditions.
Figure 6:
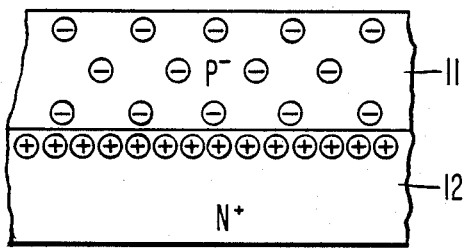
FIG. 6 shows the operation of the P− channel in the FIG. 1 embodiment under the conditions where negative charges are deposited on the signal pad.

Turning now to FIGS. 5 and 6, the mechanism by which region 11 becomes depleted will be further described. In those figures, each circled + sign represents an immobile positive charge which is produced by an N type atom from which its mobile electron has diffused away. Similarly, each circled − sign represents an immobile negative charge which is produced by a $P^-$ type atom from which its mobile hole has diffused away.

FIG. 5 shows how these immobile + and − charged atoms are distributed in the regions 11 and 12 under normal operating conditions (i.e., − the conditions of FIG. 2); and FIG. 6 shows how these immobile + and − charged atoms are distributed in the regions 11 and 12 when negative electrostatic charges 31 are deposited on input pad 20 (i.e., − the conditions of FIG. 4). These figures are based on the principle that as the magnitude of a reverse bias voltage across a P-N junction increases, the width of the depletion region at the junction also increases.

In other words, as the reverse bias across the regions 11 and 12 increases, more mobile holes are electrically pulled out of P region 11 and more mobile electrons are pulled out of the N region 12. But region 11 is $P^-$ doped (i.e., lightly doped); and so with the application of a large reverse bias voltage, region 11 becomes totally depleted of mobile holes. This is what FIG. 6 shows; and when that occurs, the resistance of region 11 increases by a factor of at least one thousand which make region 11 an open circuit.

Regions 13 and 14 operate similar to regions 11 and 12, with the only difference being that they have opposite type dopant atoms. Thus, the operation of the regions 13 and 14 may be illustrated by simply interchanging the P's and N's in FIGS. 5 and 6 and interchanging the circled + and − signs of those figures. Region 11 will then correspond to region 13, and region 12 will correspond to region 14.

Figure 7:
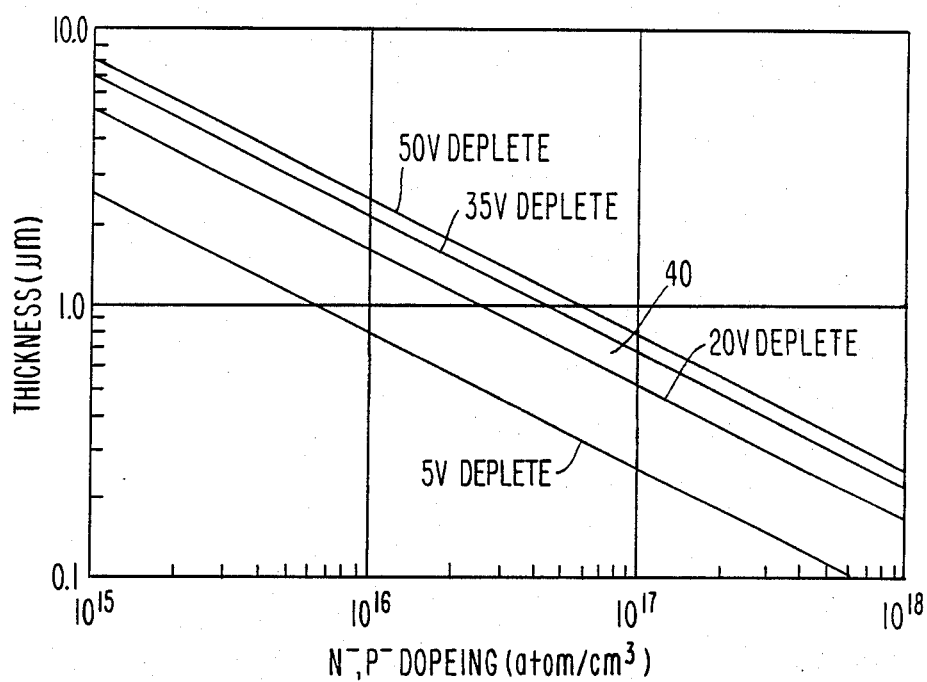
FIG. 7 is a graph which illustrates how the channels in the FIG. 1 embodiment should be constructed.

Considering now FIG. 7, it shows how the channel regions 11 and 13 can be fabricated such that they become totally depleted within a voltge range of 5 to 50 volts. This range is suitable for any conventional logic circuits since they operate between +5 and −5 volts. In FIG. 7, the doping density for regions 11 and 13 is plotted as atoms per $cm^3$ on the horizontal axis, and the thickness of those regions is plotted in micrometers on the vertical axis.

Suppose, for example, that one desires to have region 11 become totally depleted at reverse bias above twenty volts. This can be achieved by fabricating region 11 with the parameters of any point above the twenty volt depletion line (e.g., the parameters of point 40).

Figure 8:
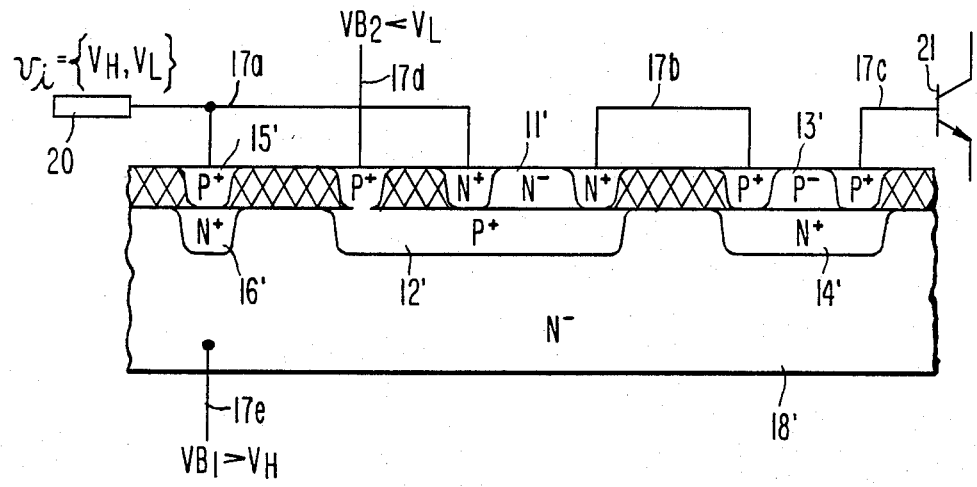
FIG. 8 is a greatly enlarged sectional view of another embodiment of the invention.

Turning next to FIG. 8, it shows another preferred embodiment of the invention which is similar to that of FIG. 1. In FIG. 8, the distinction is that all of the regions 11–16, as well as substrate 18, are doped opposite to the FIG. 1 embodiment. To note this distinction, the doped regions in FIG. 8 have the same reference numerals as corresponding regions in FIG. 1, but they also have an appended prime sign. For example, channel region 11' in FIG. 8 corresponds to channel region 11 in FIG. 1.

Operation of the FIG. 8 embodiment is similar to that which was described above in conjunction with FIGS. 2, 3 and 4. Under normal operating conditions, a conductive path is formed from input pad 20 to transistor 21 through both of the channel regions 11' and 13'. This conductive path is open circuited due to a total depletion of mobile charges from channel region 11' when an electrostatic discharge of positive charges occurs onto input pad 20; and this conductive path is open circuited due to a total depletion of mobile charges from region 13' when an electrostatic discharge of negative charges occurs on the signal pad.

Various preferred embodiments of the invention have now been described in detail. In addition, however, many changes and modifications can be made to those embodiments without departing from the nature and spirit of the invention. Accordingly, it is to be understood that the invention is not limited to the above details but is defined by the appended claims.

What is claimed is:

1. An integrated circuit chip of a type which includes a transistor in a substrate that is coupled to receive input signals from a signal pad on said substrate, wherein said chip further includes an electrostatic discharge protection circuit which is comprised of:
- a P-doped channel and an N-doped channel in said substrate, each of said channels having an input and a spaced apart output which are interconnected in series between said signal pad and said transistor;
- an N-doped region adjacent to said P-doped channel for depleting holes from the P-doped channel between its input and output terminals in response to a negative electrostatic discharge on said input signal pad;
- a P-doped region adjacent to said N-doped channel for depleting electrons from the N-doped channel between its input and output terminals in response to a positive electrostatic discharge on said input signal pad; and
- a first fixed bias voltage bus coupled to said N-doped region and a second fixed bias voltage bus coupled to said P-doped region.

2. An integrated circuit chip according to claim 1 wherein said substrate is doped P-type.

3. An integrated circuit chip according to claim 2 wherein said P-doped channel precedes said N-doped channel along said serial interconnection from said signal pad, and wherein said signal pad is coupled to said P-type substrate through another N-doped region before said P-doped channel.

4. An integrated circuit chip according to claim 3 wherein said channels are doped at least five times lighter than said regions which form P-N junctions with said channels.

5. An integrated circuit chip according to claim 4 wherein said channels are doped at $10^{15}$–$10^{18}$ atoms per cm$^3$.

6. An integrated circuit chip according to claim 5 wherein said channels are 0.1 um–10.0 um deep.

7. An integrated circuit chip according to claim 1 wherein said substrate is doped N-type.

8. An integrated circuit chip according to claim 7 wherein said N-doped channel precedes said P-doped channel along said serial interconnection from said signal pad, and wherein said signal pad is coupled to said N-type substrate through another P-doped region before said N-doped channel.

9. An integrated circuit chip according to claim 8 wherein said channels are doped at least five times lighter than said regions which form P-N junctions with said channels.

10. An integrated circuit chip according to claim 9 wherein said channels are doped at $10^{15}$–$10^{18}$ atoms per cm$^3$.

11. An integrated circuit chip according to claim 10 wherein said channels are 0.1 um–10.0 um deep.

12. An integrated circuit chip of a type which includes a transistor in a substrate that is coupled to receive input voltages from a signal pad on said substrate, wherein said chip is characterised as further including a protection circuit which is comprised of:
- a channel in said substrate that has mobile charges of a first type; said channel further having an input and a spaced apart output which are connected in series between said signal pad and said transistor;
- a doped region in said substrate adjacent to said channel that has mobile charges of a second type opposite to said first type, for substantially increasing the resistance of said channel by depleting it of said first type mobile charges when said voltages on said signal pad are outside of a predetermined voltage range; and
- a fixed bias voltage bus coupled to said doped region.

13. An integrated circuit chip according to claim 12 wherein said channel includes an N-type semiconductor, and said doped region includes a P-type semiconductor which forms a P-N junction with said N-type semiconductor.

14. An integrated circuit chip according to claim 12 wherein said channel includes a P-type semiconductor, and said doped region includes an N-type semiconductor which forms a P-N junction with said P-type semiconductor.

* * * * *